(12) United States Patent
Yoshikawa et al.

(10) Patent No.: US 12,351,906 B2
(45) Date of Patent: Jul. 8, 2025

(54) SEMICONDUCTOR FILM

(71) Applicant: NGK INSULATORS, LTD., Nagoya (JP)

(72) Inventors: Jun Yoshikawa, Nagoya (JP); Morimichi Watanabe, Nagoya (JP); Hiroshi Fukui, Obu (JP)

(73) Assignee: NGK INSULATORS, LTD., Nagoya (JP)

( * ) Notice: Subject to any disclaimer, the term of this patent is extended or adjusted under 35 U.S.C. 154(b) by 584 days.

(21) Appl. No.: 17/650,402

(22) Filed: Feb. 9, 2022

(65) Prior Publication Data
US 2022/0246427 A1 Aug. 4, 2022

Related U.S. Application Data

(63) Continuation of application No. PCT/JP2019/035694, filed on Sep. 11, 2019.

(51) Int. Cl.
*C23C 16/40* (2006.01)
*C23C 16/04* (2006.01)
(Continued)

(52) U.S. Cl.
CPC .............. *C23C 16/40* (2013.01); *C23C 16/04* (2013.01); *G01J 3/44* (2013.01);
(Continued)

(58) Field of Classification Search
CPC ..... C23C 16/40; C23C 16/04; C23C 16/4486; C23C 16/4584; G01J 3/44;
(Continued)

(56) References Cited

U.S. PATENT DOCUMENTS 10,804,362 B2* 10/2020 Tokuda ............. H01L 21/02609
2019/0055646 A1* 2/2019 Oshima ................... C23C 16/06
(Continued)

FOREIGN PATENT DOCUMENTS

CN 108987257 A 12/2018
EP 3712305 A1 * 9/2020 ............. C30B 23/06
(Continued)

OTHER PUBLICATIONS

Martin Feneberg, et al., "Anisotropic Phonon Properties and Effective Electron Mass in #-$Ga_2O_3$," *Applied Physics Letters*, 114, Apr. 10, 2019, p. 142102-142102-4 (5 pages).
(Continued)

*Primary Examiner* — Mohammed Shamsuzzaman
(74) *Attorney, Agent, or Firm* — BURR PATENT LAW, PLLC

(57) ABSTRACT

Provided is an α-$Ga_2O_3$ based semiconductor film having a crystal having a corundum-type crystal structure composed of α-$Ga_2O_3$ or an α-$Ga_2O_3$ solid solution as a main phase. This semiconductor film has a size in which the diameter of the largest circle inscribed in the outer circumference thereof is 5.08 cm (2 inches) or more, and at the center point X and each of four outer circumferential points A, B, C, and D of the largest circle on the surface of the semiconductor film, the full width at half maximum of the peak in the vicinity of 216 $cm^{-1}$ in Raman spectrum of the semiconductor film, as measured by laser Raman spectroscopy, is 6.0 $cm^{-1}$ or less.

6 Claims, 3 Drawing Sheets

(51) Int. Cl.
*G01J 3/44* (2006.01)
*H01L 21/02* (2006.01)

(52) U.S. Cl.
CPC .. *H01L 21/02271* (2013.01); *H01L 21/02414* (2013.01); *H01L 21/0242* (2013.01); *H01L 21/02433* (2013.01); *H01L 21/02565* (2013.01); *H01L 21/0262* (2013.01); *H01L 21/02628* (2013.01)

(58) Field of Classification Search
CPC ......... H01L 21/02271; H01L 21/02414; H01L 21/0242; H01L 21/02433; H01L 21/02565; H01L 21/0262; H01L 21/02628; H01L 29/04; H01L 29/24; H01L 29/872; C30B 29/16
See application file for complete search history.

(56) References Cited

U.S. PATENT DOCUMENTS

| | | | | |
|---|---|---|---|---|
| 2019/0057865 | A1* | 2/2019 | Oshima | H01L 29/24 |
| 2019/0057866 | A1* | 2/2019 | Oshima | C30B 29/16 |
| 2019/0189441 | A1* | 6/2019 | Fujita | H01L 29/778 |
| 2021/0328062 | A1* | 10/2021 | Sugimoto | H01L 29/78 |
| 2021/0335608 | A1* | 10/2021 | Yamano | H01L 21/02565 |
| 2023/0231013 | A1* | 7/2023 | Fukui | C30B 29/16 |
| 2024/0003043 | A1* | 1/2024 | Yoshikawa | C30B 7/14 |

FOREIGN PATENT DOCUMENTS

| | | |
|---|---|---|
| JP | 2014-072533 A | 4/2014 |
| JP | 2015-134717 A | 7/2015 |
| JP | 2015-196603 A | 11/2015 |
| JP | 2016-025256 A | 2/2016 |

OTHER PUBLICATIONS

R. Cuscó, et al., "Lattice Dynamics of a Mist-Chemical Vapor Deposition-Grown Corundum-Like $Ga_2O_3$ Single Crystal," *Journal of Applied Physics*, 117, May 12, 2015, pp. 185706-185706-4 (5 pages).

D. Dohy, et al, "Raman Spectra and Valence Force Field of Single-Crystalline β $Ga_2O_3$," *Journal of Solid State Chemistry*, vol. 45, No. 2, Nov. 15, 1982, pp. 180-192 (13 pages).

International Search Report and Written Opinion (Application No. PCT/JP2019/035694) dated Nov. 26, 2019 (with English).

* cited by examiner

SEMICONDUCTOR FILM

CROSS-REFERENCE TO RELATED APPLICATION

This application is a continuation application of PCT/JP2019/035694 filed Sep. 11, 2019, the entire contents all of which are incorporated herein by reference.

BACKGROUND OF THE INVENTION

1. Field of the Invention

The present invention relates to $\alpha$-$Ga_2O_3$ based semiconductor film.

2. Description of the Related Art

In recent years, gallium oxide ($Ga_2O_3$) has been attracting attention as a material for semiconductors. Gallium oxide is known to have five crystal forms of a, p, y, 6, and E, and among them, $\alpha$-$Ga_2O_3$, which is a semi-stable phase, has a very large band gap of 5.3 eV, and is expected as a material for power semiconductors.

For example, Patent Literature 1 (JP2014-72533A) discloses a semiconductor device including a base substrate having a corundum-type crystal structure, a semiconductor layer having a corundum-type crystal structure, and an insulating film having a corundum-type crystal structure, and describes an example in which an $\alpha$-$Ga_2O_3$ film is formed as a semiconductor layer on a sapphire substrate. Further, Patent Literature 2 (JP2016-25256A) discloses a semiconductor device including an n-type semiconductor layer containing a crystalline oxide semiconductor having a corundum structure as a main component, a p-type semiconductor layer containing an inorganic compound having a hexagonal crystal structure as a main component, and an electrode. In the examples of Patent Literature 2, it is disclosed that a diode is prepared by forming an $\alpha$-$Ga_2O_3$ film having a corundum structure which is a metastable phase as an n-type semiconductor layer and an $\alpha$-$Rh_2O_3$ film having a hexagonal crystal structure as a p-type semiconductor layer on a c-plane sapphire substrate.

Raman spectroscopy is known as a technique for evaluating the crystallinity of a substance. In Raman spectroscopy, the crystallinity of a substance can be evaluated by irradiating the substance with light to cause scattering, and dispersing the scattered light to obtain a Raman spectrum. For example, when the full width at half maximum of a predetermined Raman peak in the Raman spectrum of a substance is small, it can be evaluated that the crystallinity of the substance is high. For example, Non-Patent Literature 1 (Martin Feneberg et al., Anisotropic phonon properties and effective electron mass in $\alpha$-$Ga_2O_3$, Appl. Phys. Lett. 114, 142102 (2019), published online: 10 Apr. 2019) and Non-Patent Literature 2 (R. Cusco et al., Lattice dynamics of a mist-chemical vapor deposition-grown corundum-like $Ga_2O_3$ single crystal, J. Appl. Phys. 117, 185706 (2015)) disclose an $\alpha$-$Ga_2O_3$ film exhibiting a Raman peak with a relatively small full width at half maximum.

CITATION LIST

Patent Literature

Patent Literature 1: JP2014-72533A
Patent Literature 2: JP2016-25256A

Non-Patent Literature

Non-Patent Literature 1: Martin Feneberg et al., Anisotropic phonon properties and effective electron mass in $\alpha$-$Ga_2O_3$, Appl. Phys. Lett. 114, 142102 (2019), published online: 10 Apr. 2019

Non-Patent Literature 2: R. Cusco et al., Lattice dynamics of a mist-chemical vapor deposition-grown corundum-like $Ga_2O_3$ single crystal, J. Appl. Phys. 117, 185706 (2015)

SUMMARY OF THE INVENTION

The $\alpha$-$Ga_2O_3$ film has a corundum-type crystal structure, but the conventional films have a problem in that crystal quality is not high and device characteristics are insufficient (for example, when a Schottky barrier diode (SBD) is produced, the leakage current becomes large). Non-Patent Literatures 1 and 2 disclose that $\alpha$-$Ga_2O_3$ film exhibiting a Raman peak with a relatively small full width at half maximum, but in particular, when an $\alpha$-$Ga_2O_3$ film is formed using a substrate having a large diameter of 5.08 cm (2 inches) or more in diameter, it has been difficult to keep the full width at half maximum at a certain value or less over a wide range from the center portion to the outer circumferential portion of the film.

The present inventors have now found that it is possible to form an $\alpha$-$Ga_2O_3$ based semiconductor film in which the full width at half maximum of the peak of the Raman spectrum in the vicinity of 216 $cm^{-1}$ is a certain value or less over a wide range from the center portion to the outer circumferential portion of the film, thereby significantly improving the characteristics (particularly the dielectric breakdown voltage of the Schottky barrier diode) of devices produced using the $\alpha$-$Ga_2O_3$ based semiconductor film.

Accordingly, it is an object of the present invention to provide an $\alpha$-$Ga_2O_3$ based semiconductor film capable of significantly improving device characteristics (particularly, the dielectric breakdown voltage of a Schottky barrier diode).

According to an aspect of the present invention, there is provided a semiconductor film having a crystal having a corundum-type crystal structure composed of $\alpha$-$Ga_2O_3$ or an $\alpha$-$Ga_2O_3$ solid solution as a main phase, wherein the semiconductor film has a size in which a diameter of the largest circle inscribed in an outer circumference of the semiconductor film is 5.08 cm (2 inches) or more, wherein at the center point X and each of four outer circumferential points A, B, C, and D of the largest circle inscribed in the outer circumference of the semiconductor film on the surface of the semiconductor film, the full width at half maximum of a peak in the vicinity of 216 $cm^{-1}$ in Raman spectrum of the semiconductor film, as measured by laser Raman spectroscopy, is 6.0 $cm^{-1}$ or less, and wherein the outer circumferential points A, B, C, and D are determined such that i) a straight line connecting the outer circumferential points A and C and a straight line connecting the outer circumferential points B and D intersect at a right angle to each other at the center point X, and ii) the respective shortest distances of the outer circumferential points A, B, C, and D from the outer edge of the semiconductor film are ⅕ of the radius of the semiconductor film.

According to another aspect of the present invention, there is provided a composite material comprising:
 a support substrate having a size in which a diameter of the largest circle inscribed on an outer circumference is 5.08 cm (2 inches) or more; and
 the semiconductor film formed on the support substrate.

DETAILED DESCRIPTION OF THE INVENTION

Semiconductor Film

Figure 1:
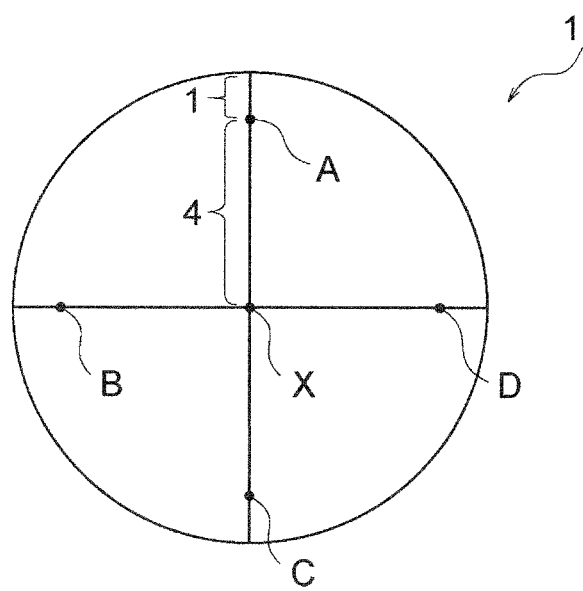
FIG. 1 is a diagram for explaining positions of a center point X and four outer circumferential points A, B, C, and D on a surface of a semiconductor film of the present invention.

The semiconductor film according to the present invention has a crystal having a corundum-type crystal structure as a main phase, and this corundum-type crystal structure is composed of $\alpha$-$Ga_2O_3$ or an $\alpha$-$Ga_2O_3$ solid solution. Therefore, the semiconductor film according to the present invention can be referred to as an $\alpha$-$Ga_2O_3$ based semiconductor film. This semiconductor film has a size in which the diameter of the largest circle inscribed in the outer circumference thereof (hereinafter, referred to as the largest inscribed circle) is 5.08 cm (2 inches) or more. Typically, the semiconductor film has a circular shape having a diameter of 5.08 cm (2 inches) or more, in which case the largest inscribed circle of the semiconductor film 10 may coincide with the outer circumference as shown in FIG. 1. Further, at the center point X and each of four outer circumferential points A, B, C, and D of the largest inscribed circle of the semiconductor film on the surface of the semiconductor film, the full width at half maximum of the peak in the vicinity of 216 $cm^{-1}$ in Raman spectrum of the semiconductor film, as measured by laser Raman spectroscopy, is 6.0 $cm^{-1}$ or less. As in the semiconductor film 10 shown in FIG. 1, the outer circumferential points A, B, C, and D of the largest inscribed circle are determined such that i) a straight line connecting the outer circumferential points A and C and a straight line connecting the outer circumferential points B and D intersect at a right angle to each other at the center point X, and ii) the respective shortest distances of the outer circumferential points A, B, C, and D from the outer edge of the semiconductor film are $\frac{1}{5}$ of the radius of the semiconductor film. The $\alpha$-$Ga_2O_3$ based semiconductor film in which the full width at half maximum of the peak in the vicinity of 216 $cm^{-1}$ in Raman spectrum of the semiconductor film is 6.0 $cm^{-1}$ or less at five points sufficiently separated from each other as described above can be said to have a small full width at half maximum over a wide range from the center portion to the outer circumferential portion of the film, and can significantly improve the characteristics (particularly the dielectric breakdown voltage of the Schottky barrier diode) of devices produced using such a semiconductor film. As described above, in the related art, when an $\alpha$-$Ga_2O_3$ film is formed using a substrate having a large diameter of 5.08 cm (2 inches) or more in diameter, it has been difficult to keep the full width at half maximum at a certain value or less over a wide range from the center portion to the outer circumferential portion of the film. However, according to the present invention, it is possible to solve the problem and provide an $\alpha$-$Ga_2O_3$ based semiconductor film in which the full width at half maximum of the peak of the Raman spectrum in the vicinity of 216 $cm^{-1}$ is reduced over a wide range such that the device characteristics (in particular, the dielectric breakdown voltage of a Schottky barrier diode) can be significantly improved.

As described above, the semiconductor film of the present invention has a crystal having a corundum-type crystal structure as a main phase. Herein, "having a crystal having a corundum-type crystal structure as a main phase" means that the crystal having a corundum-type crystal structure is 80% by weight or more, preferably 90% by weight or more, more preferably 95% by weight or more, still more preferably 97% by weight or more, particularly preferably 99% by weight or more, and most preferably 100% by weight of the semiconductor film. This corundum-type crystal structure is composed of an $\alpha$-$Ga_2O_3$ or $\alpha$-$Ga_2O_3$ solid solution. $\alpha$-$Ga_2O_3$ belongs to a trigonal crystal group and has a corundum-type crystal structure, and its c-plane is three-fold symmetric. Further, the $\alpha$-$Ga_2O_3$ solid solution is a solid solution in which other components are dissolved in $\alpha$-$Ga_2O_3$, and the corundum-type crystal structure is maintained. For example, the semiconductor film of the present invention may be composed of an $\alpha$-$Ga_2O_3$ solid solution in which one or more components selected from the group consisting of $Cr_2O_3$, $Fe_2O_3$, $Ti_2O_3$, $V_2O_3$, $Ir_2O_3$, $Rh_2O_3$, $In_2O_3$, and $Al_2O_3$ are dissolved in $\alpha$-$Ga_2O_3$. All of these components have a corundum-type crystal structure, and their lattice constants are relatively close to each other. Therefore, the metal atoms of these components easily replace Ga atoms in the solid solution. Further, by dissolving these components in solid solution, it becomes possible to control the band gap, electrical characteristics, and/or lattice constant of the semiconductor film. The amount of solid solution of these components can be appropriately changed according to the desired characteristics. Further, the $\alpha$-$Ga_2O_3$ solid solution may contain, as other components, elements such as Si, Sn, Ge, N, and Mg as dopants.

The semiconductor film of the present invention may have a size in which the diameter of the largest circle inscribed in the outer circumference thereof (that is, largest inscribed circle) is 5.08 cm (2 inches) or more, and the diameter of the largest inscribed circle may be 10.0 cm or larger. The upper limit value of the diameter of the largest inscribed circle is not particularly limited, but is typically 30.0 cm or less, and more typically 20.0 cm or less. A typical semiconductor film has a circular shape, in which case the diameter of the largest inscribed circle of the semiconductor film 10 may coincide with the diameter of the semiconductor film 10 as shown in FIG. 1. Herein, the "circular shape" need not be a complete circular shape, but may be a substantially circular shape which can be generally recognized as a circular shape as a whole. For example, the shape may be a shape in which a portion of a circle is cut out for the purpose of specifying the crystal orientation or other purposes, or a shape in which a slit is provided in a portion of a circle, and in this case, the size may be determined based on the diameter of the largest circle inscribed on the cut outer circumference or the outer circumference excluding the slit. The semiconductor film of the present invention is characterized in that the full width at half maximum of the peak in the vicinity of 216 cm$^{-1}$ in Raman spectrum is small, and the center point X and outer circumferential points A, B, C, and D are only specified for convenience so that the representative full width at half maximum of the peak of the entire semiconductor film can be evaluated. Therefore, in order to uniquely determine the positions of the center point X and the outer circumferential points A, B, C and D, the shape of the semiconductor film is described as typically circular, but the essential meaning is no different even when the shape of the semiconductor film is not circular. For example, even when the shape of the semiconductor film is square or rectangular (oblong), it is included in the semiconductor film of the present invention as long as the full width at half maximum of a peak in the vicinity of 216 cm$^{-1}$ of the semiconductor film is small. In the semiconductor film having such a shape, the largest circle inscribed in the outer circumference (largest inscribed circle) of the film when a square or rectangular semiconductor film is viewed from the top is defined as a virtual circle, and the positions of the outer circumferential points A, B, C and D may be determined from the center point X of the virtual circle and the diameter of the virtual circle (in the same manner as in the case of the circular semiconductor film described above). By evaluating the full width at half maximum of the peak in the vicinity of 216 cm$^{-1}$ at the center point X and the outer circumferential points A, B, C, and D determined in this way, the same evaluation as that of the circular semiconductor film can be performed. Note that even when a slit is provided in a portion of the square or rectangular semiconductor film, the largest circle inscribed in the outer circumference (largest inscribed circle) of the film when the square or rectangular semiconductor film is viewed from the top is defined as a virtual circle.

In the semiconductor film of the present invention, at the center point X and each of four outer circumferential points A, B, C, and D of the largest inscribed circle of the semiconductor film on the surface thereof, the full width at half maximum of the peak in the vicinity of 216 cm$^{-1}$ in Raman spectrum of the semiconductor film, as measured by laser Raman spectroscopy, is 6.0 cm$^{-1}$ or less, preferably 5.0 cm$^{-1}$ or less, and more preferably 4.0 cm$^{-1}$ or less. From the viewpoint of improving device characteristics, the smaller the full width at half maximum of the peak in the vicinity of 216 cm$^{-1}$ in Raman spectrum, the better, so the lower limit value of the full width at half maximum of the peak in the vicinity of 216 cm$^{-1}$ in Raman spectrum is not particularly limited, but is typically 0.1 cm$^{-1}$ or more, more typically 1.0 cm$^{-1}$ or more.

In the semiconductor film of the present invention, when $W_M$ is an arithmetic average value of full width at half maximum of the peak in the vicinity of 216 cm$^{-1}$ in Raman spectrum measured at the center point X and the outer circumferential points A, B, C, and D of the largest inscribed circle and $W_S$ is a standard deviation of the full widths at half maximum, $W_S/W_M$ is preferably $8.0\times10^{-2}$ or less, more preferably $6.0\times10^{-2}$ or less, still more preferably $4.0\times10^{-2}$ or less, and most preferably $3.0\times10^{-2}$ or less. When $W_S/W_M$ is within the above range, it means that the standard deviation $W_S$ with respect to the arithmetic average value $W_M$ of the full width at half maximum is relatively small over a wide range from the center portion to the outer circumferential portion of the semiconductor film, and $W_S/W_M$ can thus be regarded as an index of the variance of the full width at half maximum converted so as not to be affected by the absolute value of the full width at half maximum. Therefore, the characteristics of the device produced by using the semiconductor film of the present invention can be made equalized. The term "equalization of device characteristics" means that even when a plurality of devices is produced from different portions of the same semiconductor film, there is little variation in device characteristics among the plurality of devices obtained thereby (the devices are equalized). From the viewpoint of equalizing the device characteristics, the smaller $W_S/W_M$, the better, the lower limit value of $W_S/W_M$ is not particularly limited, but is typically $1.0\times10^{-4}$ or more, and more typically $1.0\times10^{-3}$ or more.

From the viewpoint of improving and equalizing the device characteristics, in the semiconductor film of the present invention, the arithmetic average value of the film thickness measured at the center point X and the outer circumferential points A, B, C, and D of the largest inscribed circle is preferably 2.0 μm or more, more preferably 3.0 μm or more, and still more preferably 5.0 μm or more. When the film thickness is large as described above, it is possible to avoid deterioration of the device characteristics due to the occurrence of cracks during device production, and it is possible to more effectively improve and equalize the device characteristics. The upper limit of the film thickness is not particularly limited and may be appropriately adjusted from the viewpoint of cost and required characteristics, but is, for example, 50 μm or less, 20 μm or less, or 10 μm or less. In a case where a self-standing semiconductor film is required, a thick film may be used, and from such a viewpoint, the thickness is, for example, 50 μm or more, or 100 μm or more, and there is no particular upper limit unless there is a cost limitation.

In the semiconductor film of the present invention, at each of the center point X and the outer circumferential points A, B, C, and D of the largest inscribed circle, the wave number of the peak top of the peak in the vicinity of 216 cm$^{-1}$ in Raman spectrum is preferably 217.8 cm$^{-1}$ or less, more preferably 217.5 cm$^{-1}$ or less, still more preferably 216.5 cm$^{-1}$ or less, and most preferably 215.5 cm$^{-1}$ or less. By doing so, the device characteristics can be further improved. The lower limit value of the wave number of the peak top of the peak in the vicinity of 216 cm$^{-1}$ in Raman spectrum is not particularly limited, but is typically 210.0 cm$^{-1}$ or more, more typically 211.0 cm$^{-1}$ or more, and still more typically 212.0 cm$^{-1}$ or more.

The semiconductor film of the present invention can contain a Group 14 element as a dopant. Here, the term "Group 14 element" refers to a Group 14 element according to the periodic table formulated by the IUPAC (International Union of Pure and Applied Chemistry), and specifically, is any one of carbon (C), silicon (Si), germanium (Ge), tin (Sn) and lead (Pb). The content of the dopant (Group 14 element) in the semiconductor film is preferably $1.0\times10^{16}$ to $1.0\times10^{21}$/cm$^3$, more preferably $1.0\times10^{17}$ to $1.0\times10^{19}$/cm$^3$. It is preferable that these dopants are uniformly distributed in the film and the dopant concentrations on the top surface and the bottom surface of the semiconductor film are about the same.

The semiconductor film of the present invention may be in the form of a self-standing film of a single film or may be formed on a support substrate. In the latter case, the semiconductor film of the present invention is preferably formed on a support substrate having a size in which the diameter of the largest inscribed circle is 5.08 cm (2 inches) or more (for example, a support substrate with a circular shape having a size having a diameter of 5.08 cm (2 inches) or more). That is, according to a preferred aspect of the present invention, a composite material including a support substrate having a size in which the diameter of the largest inscribed circle is 5.08 cm (2 inches) or more (for example, a support substrate with a circular shape having a size having a diameter of 5.08 cm (2 inches) or more) and a semiconductor film formed on the support substrate. The diameter of the largest inscribed circle may be 10.0 cm or more as in the case of the semiconductor film, and the upper limit value is not particularly limited, but is typically 30.0 cm or less in diameter, and more typically 20.0 cm or less in diameter.

The support substrate is preferably a substrate having a corundum structure and oriented in two axes, the c-axis and the a-axis (biaxial orientation substrate). By using a biaxial orientation substrate having a corundum structure as the support substrate, the semiconductor film can also serve as a seed crystal for heteroepitaxial growth. The biaxial orientation substrate may be a polycrystal, a mosaic crystal (a set of crystals of which crystal orientations are slightly deviated), or a single-crystal such as sapphire or $Cr_2O_3$. As long as it has a corundum structure, it may be composed of a single material or a solid solution of a plurality of materials. The main component of the support substrate is a material selected from the group consisting of $\alpha$-$Cr_2O_3$, $\alpha$-$Fe_2O_3$, $\alpha$-$Ti_2O_3$, $\alpha$-$V_2O_3$, $\alpha$-$Rh_2O_3$, and $\alpha$-$Al_2O_3$, or a solid solution containing two or more selected from the group consisting of $\alpha$-$Al_2O_3$, $\alpha$-$Cr_2O_3$, $\alpha$-$Fe_2O_3$, $\alpha$-$Ti_2O_3$, $\alpha$-$V_2O_3$, and $\alpha$-$Rh_2O_3$. Among them, sapphire ($\alpha$-$Al_2O_3$ single-crystal) is particularly preferable from the viewpoint of excellent thermal conductivity and commercial availability of large-area and high-quality substrates, and $\alpha$-$Cr_2O_3$ or solid solutions of $\alpha$-$Cr_2O_3$ and different materials are particularly preferable from the viewpoint of reduction of crystal defects.

Further, as a seed crystal for support substrate and heteroepitaxial growth, a composite base substrate in which an orientation layer composed of a material having a corundum-type crystal structure having an a-axis length and/or a c-axis length larger than that of sapphire is formed on a corundum single crystal such as sapphire or $Cr_2O_3$ can be used. The orientation layer contains a material selected from the group consisting of $\alpha$-$Cr_2O_3$, $\alpha$-$Fe_2O_3$, $\alpha$-$Ti_2O_3$, $\alpha$-$V_2O_3$, and $\alpha$-$Rh_2O_3$, or a solid solution containing two or more selected from the group consisting of $\alpha$-$Al_2O_3$, $\alpha$-$Cr_2O_3$, $\alpha$-$Fe_2O_3$, $\alpha$-$Ti_2O_3$, $\alpha$-$V_2O_3$, and $\alpha$-$Rh_2O_3$.

Further, the semiconductor film prepared on the base substrate for film formation may be separated and reprinted on another support substrate. The material of the other support substrate is not particularly limited, but a suitable material may be selected from the viewpoint of material properties. For example, from the viewpoint of thermal conductivity, a metal substrate made of Cu or the like, a ceramic substrate made of SiC, AlN or the like, is preferably used. It is also preferable to use a substrate having a coefficient of thermal expansion of 6 to 13 ppm/K at 25 to 400° C. By using a support substrate having such a coefficient of thermal expansion, the difference in thermal expansion between the semiconductor film and the support substrate can be reduced, and as a result, the occurrence of cracks in the semiconductor film due to thermal stress and the detachment of the film can be suppressed. An example of such a support substrate is a substrate made of a Cu—Mo composite metal. The composite ratio of Cu and Mo can be appropriately selected in consideration of the matching of the coefficient of thermal expansion with the semiconductor film, the thermal conductivity, the conductivity and the like.

Method for Manufacturing Semiconductor Film

The semiconductor film of the present invention can be manufactured by using a sapphire substrate or a composite base substrate as a base substrate and forming a film of an $\alpha$-$Ga_2O_3$ material thereon (on an orientation layer in the case of the composite based substrate). The semiconductor layer can be formed by a known method, and preferred examples thereof include a mist CVD method (mist chemical vapor deposition method), an HVPE method (halide vapor deposition method), and an MBE method (molecular beam epitaxy method), and the mist CVD method or the HVPE method is particularly preferred. An $\alpha$-$Ga_2O_3$ based semiconductor film in which the full width at half maximum of the peak of the Raman spectrum in the vicinity of 216 $cm^{-1}$ is small over a wide range from the center portion to the outer circumferential portion of the film can be realized by forming the film while rotating a sapphire substrate or by using a composite base substrate.

Figure 2:
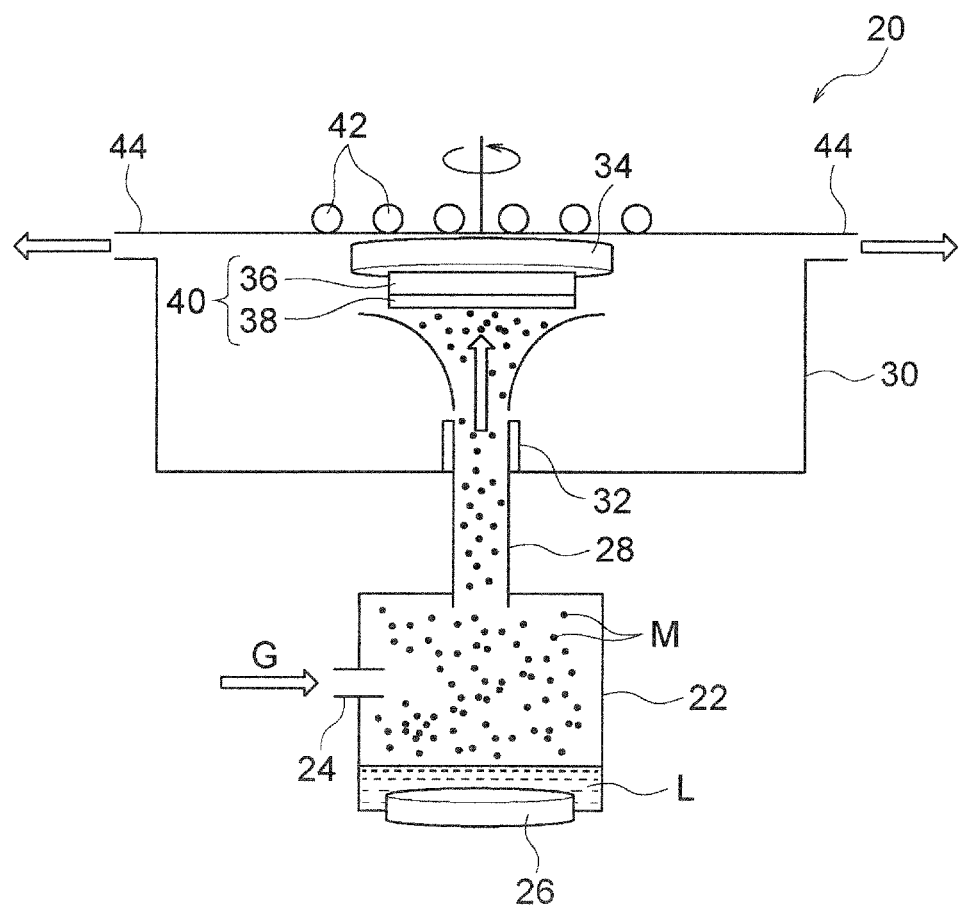
FIG. 2 is a schematic cross-sectional view showing a configuration of a mist chemical vapor deposition (CVD) apparatus.

That is, when a sapphire substrate is used as the base substrate, the film is formed while rotating the substrate 36 in the in-plane direction as in the apparatus shown in FIG. 2 described later. At this time, by setting appropriate conditions, it is possible to set the full width at half maximum of the peak of the Raman spectrum in the vicinity of 216 $cm^{-1}$ within a predetermined range even with a larger substrate size. By rotating the substrate to generate centrifugal force, the airflow in the vicinity of the substrate 36 can be conveniently controlled so as to bring about film uniformity.

On the other hand, when a composite base substrate is used as the base substrate, it is not always necessary to rotate the substrate to form a film, but the substrate may be rotated. In any case, by setting appropriate rotation conditions and/or film formation conditions, it is possible to make the full width at half maximum of the peak of the Raman spectrum in the vicinity of 216 $cm^{-1}$ smaller and the standard deviation thereof smaller even with a larger substrate size.

Hereinafter, the mist CVD method, which is one of the particularly preferable film forming methods, will be described.

The mist CVD method is a method in which a raw material solution is atomized or formed into droplets to generate mist or droplets, the mist or droplets are transported to a film forming chamber including a substrate using a carrier gas, and the mist or droplets are thermally decomposed and chemically reacted in the film forming chamber to form and grow a film on the substrate, and thus does not require a vacuum process and can produce a large number of samples in a short time. Here, FIG. 2 shows an example of a mist CVD apparatus. A mist CVD apparatus 20 shown in FIG. 2 has a mist generating chamber 22 that generates a mist M from a carrier gas G and a raw material solution L, and a film forming chamber 30 that sprays the mist M onto a substrate 36 to form a semiconductor film 38 through thermal decomposition and chemical reaction. The mist generating chamber 22 includes a carrier gas introduction port 24 into which the carrier gas G is introduced, an ultrasonic vibrator 26 provided in the mist generating chamber 22, and a duct 28 that conveys the mist M generated in the mist generating chamber 22 to the film forming chamber 30. The raw material solution L is stored in the mist generating chamber 22. The ultrasonic vibrator 26 is configured to apply ultrasonic vibration to the raw material solution L to generate the mist M together with the carrier gas G. The film forming chamber 30 includes a nozzle 32 for spraying the mist M introduced through the duct 28 onto the substrate 36, a rotary stage 34 to which the substrate 36 is fixed, a heater 42 provided near the rear surface of the rotary stage 34 for heating the rotary stage 34 and the substrate 36, and an exhaust port 44 for discharging the carrier gas G. The rotary stage 34 is configured to be rotatable in the in-plane direction when the mist M is sprayed onto the substrate 36. By forming the semiconductor film 38 while rotating the substrate 36 in this configuration, it is possible to form an α-$Ga_2O_3$ based semiconductor film in which the full width at half maximum of the peak of the Raman spectrum in the vicinity of 216 $cm^{-1}$ is small over a wide range from the center portion to the outer circumferential portion of the film even when the semiconductor film 38 is formed using a substrate having a large diameter of 5.08 cm (2 inches) or more.

The raw material solution L used in the mist CVD method is not limited as long as an α-$Ga_2O_3$ based semiconductor film can be obtained, and examples thereof include an organometallic complex or halide of Ga and/or a metal forming a solid solution with Ga dissolved in a solvent. Examples of organometallic complexes include acetylacetonate complexes. Further in a case where a dopant is added to the semiconductor layer, a solution of a dopant component may be added to the raw material solution. Furthermore, an additive such as hydrochloric acid may be added to the raw material solution. Water, alcohol, or the like can be used as the solvent.

Next, the obtained raw material solution L is atomized or formed into droplets to generate mist M or droplet. A preferable example of the atomizing or droplet forming method is a method of vibrating the raw material solution L using the ultrasonic vibrator 26. Then, the obtained mist M or droplet is transported to the film forming chamber 30 using a carrier gas G. The carrier gas G is not particularly limited, but one or two or more of an inert gas such as oxygen, ozone and nitrogen, and a reducing gas such as hydrogen can be used.

The substrate 36 is provided in the film forming chamber 30. The mist M or droplet transported to the film forming chamber 30 is thermally decomposed and chemically reacted there to form the semiconductor film 38 on the substrate 36. The reaction temperature varies depending on the kind of the raw material solution L, but is preferably 300 to 800° C., and more preferably 400 to 700° C. Further, the atmosphere in the film forming chamber 30 is not particularly limited as long as a desired semiconductor film can be obtained, but is typically selected from any of an oxygen gas atmosphere, an inert gas atmosphere, a vacuum atmosphere, a reducing atmosphere, and an air atmosphere. The semiconductor film thus obtained can be formed as it is or divided into semiconductor elements. Alternatively, the semiconductor film may be detached off from the composite base substrate to form a single film. In this case, in order to facilitate the detachment from the composite base substrate, a semiconductor film in which a release layer is provided in advance on the orientation layer surface (film forming surface) of the composite base substrate may be used. Examples of such a release layer include those provided with a C injection layer and an H injection layer on the surface of the composite base substrate. Further, C or H may be injected into the film at the initial stage of film formation of the semiconductor film, and a release layer may be provided on the semiconductor film side. Furthermore, it is also possible to adhere and bond a support substrate (mounting substrate) different from the composite base substrate to the surface of the semiconductor film formed on the composite base substrate (that is, the opposite side of the composite base substrate), and then detach and remove the composite base substrate from the semiconductor film. As such a support substrate (mounting substrate), a substrate having a coefficient of thermal expansion at 25 to 400° C. of 6 to 13 ppm/K, for example, a substrate composed of a Cu—Mo composite metal can be used. Further, example of the method of adhering and bonding the semiconductor film and the support substrate (mounting substrate) include known methods such as brazing, soldering, and solid phase bonding. Further, an electrode such as an ohmic electrode or a Schottky electrode, or another layer such as an adhesive layer may be provided between the semiconductor film and the support substrate.

Method for Manufacturing Composite Base Substrate

The composite base substrate described above can be preferably manufactured by (a) providing a sapphire substrate, (b) preparing a predetermined orientation precursor layer, (c) performing heat treatment on the orientation precursor layer on the sapphire substrate to convert at least a portion near the sapphire substrate into an orientation layer, and optionally (d) subjecting the orientation layer to processing such as grinding or polishing to expose the surface of the orientation layer. This orientation precursor layer becomes an orientation layer by heat treatment and contains a material having a corundum-type crystal structure having an a-axis length and/or c-axis length larger than that of sapphire, or a material capable of having a corundum-type crystal structure having an a-axis length and/or c-axis length larger than that of sapphire by heat treatment to be described later. Further, the orientation precursor layer may contain trace components in addition to the material having a corundum-type crystal structure. According to such a production method, the growth of the orientation layer can be promoted by using the sapphire substrate as a seed crystal. That is, the high crystallinity and crystal orientation peculiar to the single-crystal of the sapphire substrate are inherited by the orientation layer.

(a) Provision of Sapphire Substrate

To prepare the base substrate, first, a sapphire substrate is provided. The sapphire substrate used may have any orientation plane. That is, the sapphire substrate may have an α-plane, a c-plane, an r-plane, or an m-plane, or may have a predetermined off-angle with respect to these planes. For example, in a case where a c-plane sapphire is used, since the c-axis is oriented with respect to the surface, it is possible to easily heteroepitaxially grow a c-axis oriented orientation layer thereon. A sapphire substrate to which a dopant is added may also be used to adjust electrical properties. As such a dopant, a known dopant can be used.

(b) Preparation of Orientation Precursor Layer

An orientation precursor layer containing a material having a corundum-type crystal structure having an a-axis length and/or c-axis length larger than that of sapphire, or a material capable of having a corundum-type crystal structure having an a-axis length and/or c-axis length larger than that of sapphire by heat treatment is prepared. The method for forming the orientation precursor layer is not particularly limited, and a known method can be adopted. Examples of the method for forming the orientation precursor layer include an aerosol deposition (AD) method, a sol-gel method, a hydrothermal method, a sputtering method, an evaporation method, various chemical vapor deposition (CVD) methods, a PLO method, a chemical vapor transport (CVT) method, and a sublimation method. Examples of the CVD method include a thermal CVD method, a plasma CVD method, a mist CVD method, and an MO (metal organic) CVD method. Alternatively, a method may be used in which a molded body of the orientation precursor is prepared in advance and the molded body is placed on a sapphire substrate. Such a molded body can be produced by molding the material of the orientation precursor by a method such as tape casting or press molding. Further, it is also possible to use a method in which a polycrystal prepared in advance by various CVD methods, sintering, or the like is used as the orientation precursor layer and is placed on a sapphire substrate.

However, an aerosol deposition (AD) method, various CVD methods, or a sputtering method is preferred. By using these methods, a dense orientation precursor layer can be formed in a relatively short time, and heteroepitaxial growth using a sapphire substrate as a seed crystal can be easily caused. In particular, the AD method does not require a high vacuum process and has a relatively high film formation rate, and is therefore preferable in terms of production cost. In the case of using a sputtering method, a film can be formed using a target of the same material as that of the orientation precursor layer, but a reactive sputtering method in which a film is formed in an oxygen atmosphere using a metal target can also be used. A method of placing a molded body prepared in advance on sapphire is also preferable as a simple method, but since the orientation precursor layer is not dense, a process of densification is required in the heat treatment step described later. In the method of using a polycrystalline prepared in advance as an orientation precursor layer, two steps of a step of preparing a polycrystalline body and a step of performing heat treatment on a sapphire substrate are required. Further, in order to improve the adhesion between the polycrystal and the sapphire substrate, it is necessary to take measures such as keeping the surface of the polycrystal sufficiently smooth. Although known conditions can be used for any of the methods, a method of directly forming an orientation precursor layer using an AD method and a method of placing a molded body prepared in advance on a sapphire substrate will be described below.

Figure 3:
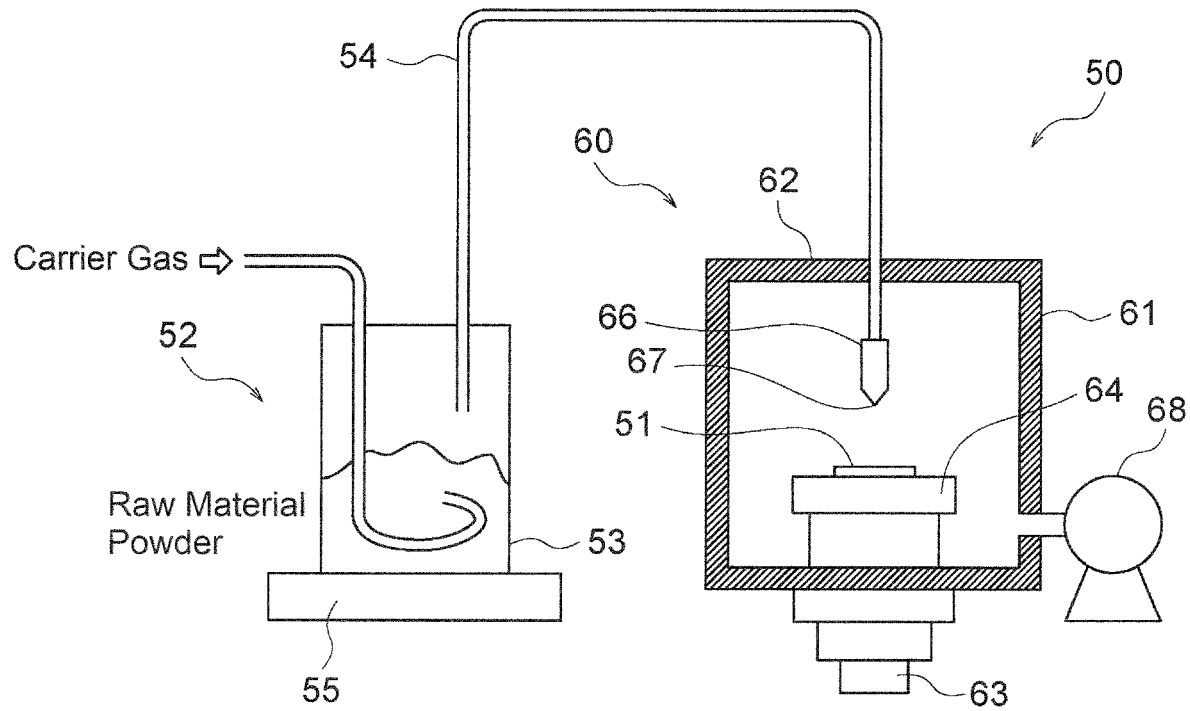
FIG. 3 is a schematic cross-sectional view showing a configuration of an aerosol deposition (AD) apparatus.

The AD method is a technique for forming a film by mixing fine particles or a fine particle raw material with a gas to form an aerosol, and impacting the aerosol on a substrate by injecting the aerosol at a high speed from a nozzle, and has a feature of forming a film densified at ordinary temperature. FIG. 3 shows an example of a film forming apparatus (aerosol deposition (AD) apparatus) used in such an AD method. The film forming apparatus 50 shown in FIG. 3 is configured as an apparatus used in an AD method in which a raw material powder is injected onto a substrate in an atmosphere having a pressure lower than atmospheric pressure. The film forming apparatus 50 includes an aerosol generating unit 52 that generates an aerosol of raw material powder containing raw material components, and a film forming unit 60 that forms a film containing the raw material components by injecting the raw material powder onto the sapphire substrate 51. The aerosol generating unit 52 includes an aerosol generating chamber 53 that stores raw material powder and receives a carrier gas supply from a gas cylinder (not shown) to generate an aerosol, and a raw material supply pipe 54 that supplies the generated aerosol to the film forming unit 60, and a vibrator 55 that applies vibration at frequencies of 10 to 100 Hz to the aerosol generating chamber 53 and the aerosol therein. The film forming unit 60 has a film forming chamber 62 that injects aerosols onto the sapphire substrate 51, a substrate holder 64 that is disposed inside the film forming chamber 62 and fixes the sapphire substrate 51, and an X-Y stage 63 that moves the substrate holder 64 in the X-Y axis direction. Further, the film forming unit 60 includes an injection nozzle 66 in which a slit 67 is formed at a tip thereof to inject aerosol into the sapphire substrate 51, and a vacuum pump 68 for reducing the pressure in the film forming chamber 62.

It is known that the AD method can control a film thickness, a film quality, and the like according to film forming conditions. For example, the form of the AD film is easily affected by the collision rate of the raw material powder to the substrate, the particle size of the raw material powder, the aggregated state of the raw material powder in the aerosol, the injection amount per unit time, and the like. The collision rate of the raw material powder with the substrate is affected by the differential pressure between the film forming chamber 62 and the injection nozzle 66, the opening area of the injection nozzle, and the like. If appropriate conditions are not used, the coating may become a green compact or generate pores, so it is necessary to appropriately control these factors.

In a case where a molded body in which the orientation precursor layer is prepared in advance is used, the raw material powder of the orientation precursor can be molded to prepare the molded body. For example, in a case where press molding is used, the orientation precursor layer is a press molded body. The press molded body can be prepared by press-molding the raw material powder of the orientation precursor based on a known method, and may be prepared, for example, by placing the raw material powder in a mold and pressing the raw material powder at pressures of preferably 100 to 400 kgf/cm$^2$, and more preferably 150 to 300 kgf/cm$^2$. The molding method is not particularly limited, and in addition to press molding, tape casting, slip casting, extrusion molding, doctor blade method, and any combination thereof can be used. For example, in the case of using tape casting, it is preferable that additives such as a binder, a plasticizer, a dispersant, and a dispersion medium are appropriately added to the raw material powder to form a slurry, and the slurry is discharged and molded into a sheet shape by passing through a slit-shaped thin discharge port. The thickness of the molded body formed into a sheet is not limited, but is preferably 5 to 500 μm from the viewpoint of handling. Further, in a case where a thick orientation precursor layer is required, a large number of these sheet molded bodies may be stacked and used as a desired thickness.

In these molded bodies, the portion near the sapphire substrate becomes an orientation layer by the subsequent heat treatment on the sapphire substrate. As described above, in such a method, it is necessary to sinter and densify the molded body in the heat treatment step described later. Therefore, the molded body may contain trace components such as a sintering aid in addition to the material having or resulting in a corundum-type crystal structure.

(c) Heat Treatment of Orientation Precursor Layer on Sapphire Substrate

A heat treatment is performed on the sapphire substrate on which the orientation precursor layer is formed at a temperature of 1000° C. or more. By this heat treatment, at least a portion of the orientation precursor layer near the sapphire substrate can be converted into a dense orientation layer. Further, this heat treatment enables heteroepitaxial growth of the orientation layer. That is, by forming the orientation layer with a material having a corundum-type crystal structure, heteroepitaxial growth occurs in which the material having a corundum-type crystal structure crystal grows using a sapphire substrate as a seed crystal during heat treatment. At that time, the crystals are rearranged, and the crystals are arranged according to the crystal plane of the sapphire substrate. As a result, the crystal axes of the sapphire substrate and the orientation layer can be aligned.

For example, when a c-plane sapphire substrate is used, both the sapphire substrate and the orientation layer can be c-axis oriented with respect to the surface of the base substrate. Moreover, this heat treatment makes it possible to form a gradient composition region in a part of the orientation layer. That is, during the heat treatment, a reaction occurs at the interface between the sapphire substrate and the orientation precursor layer, and the Al component in the sapphire substrate diffuses into the orientation precursor layer, and/or the component in the orientation precursor layer diffuses into the sapphire substrate, thereby forming a gradient composition region composed of a solid solution containing $\alpha\text{-}Al_2O_3$.

It is known that methods such as various CVD methods, a sputtering method, a PLD method, a CVT method, and a sublimation method may cause heteroepitaxial growth on a sapphire substrate without heat treatment at 1000° C. or more. However, it is preferable that the orientation precursor layer is in a non-oriented state, that is, amorphous or non-oriented polycrystalline, at the time of preparation thereof, and the crystal rearrangement is caused by using sapphire as a seed crystal at the time of the heat treatment step. By doing so, it is possible to effectively reduce the crystal defects that reach the surface of the orientation layer. The reason for this is not clear, but it is considered that the crystal defects generated in the lower portion of the orientation layer are likely to be annihilated.

The heat treatment is not particularly limited as long as a corundum-type crystal structure is obtained and heteroepitaxial growth using a sapphire substrate as a seed occurs, and can be performed in a known heat treatment furnace such as a tubular furnace or a hot plate. Further, in addition to the heat treatment under normal pressure (without pressing), a heat treatment under pressure such as hot pressing or HIP, or a combination of a heat treatment under normal pressure and a heat treatment under pressure can also be used. The heat treatment conditions can be appropriately selected depending on the material used for the orientation layer. For example, the atmosphere of the heat treatment can be selected from the air, vacuum, nitrogen and inert gas atmosphere. The preferred heat treatment temperature also varies depending on the material used for the orientation layer, but is preferably 1000 to 2000° C., and more preferably 1200 to 2000° C., for example. The heat treatment temperature and the retention time are related to the thickness of the orientation layer formed by heteroepitaxial growth and the thickness of the gradient composition region formed by diffusion with the sapphire substrate, and can be appropriately adjusted depending on the kind of the material, the target orientation layer, the thickness of the gradient composition region, and the like. However, in the case of using molded body prepared in advance is used as the orientation precursor layer, it is necessary to perform sintering and densification during heat treatment, and normal pressure firing at a high temperature, hot pressing, HIP, or a combination thereof is suitable. For example, when using a hot press, the surface pressure is preferably 50 kgf/cm$^2$ or more, more preferably 100 kgf/cm$^2$ or more, particularly preferably 200 kgf/cm$^2$ or more, the upper limit is not particularly limited. The firing temperature is also not particularly limited as long as sintering, densification, and heteroepitaxial growth occur, but is preferably 1000° C. or more, more preferably 1200° C. or more, still more preferably 1400° C. or more, and particularly preferably 1600° C. or more. The firing atmosphere can also be selected from atmosphere, vacuum, nitrogen and an inert gas atmosphere. As the firing jig such as a mold, those made of graphite or alumina can be used.

(d) Exposure of Surface of Orientation Layer

On the orientation layer formed near the sapphire substrate by the heat treatment, an orientation precursor layer or a surface layer having poor orientation or no orientation may exist or remain. In this case, it is preferable that the surface derived from the orientation precursor layer is subjected to processing such as grinding or polishing to expose the surface of the orientation layer. By doing so, a material having excellent orientation is exposed on the surface of the orientation layer, so that the semiconductor layer can be effectively epitaxially grown on the material. The method for removing the orientation precursor layer and the surface layer is not particularly limited, and examples thereof include a method for grinding and polishing and a method for ion beam milling. The surface of the orientation layer is preferably polished by lapping using abrasive grains or chemical mechanical polishing (CMP).

EXAMPLES

The present invention will be described in more detail with reference to the following examples.

Example 1

(1) Preparation of $\alpha\text{-}Ga_2O_3$ Based Semiconductor Film by Mist CVD Method
(1a) Preparation of Raw Material Solution 0.05 mol/L aqueous gallium acetylacetonate was prepared, and concentrated 12N hydrochloric acid was added thereto at a volumetric proportion of 1.5%. Tin (II) chloride was added to the obtained mixed solution to a concentration of 0.001 mol/L to prepare a raw material solution.
(1b) Provision for Film Formation The mist CVD apparatus 20 having a configuration shown in FIG. 2 was provided. The configuration of the mist CVD apparatus 20 is as described above. In the mist CVD apparatus 20, the raw material solution L obtained in (1a) above was stored in the mist generating chamber 22. A c-plane sapphire substrate having a diameter of 5.08 cm (2 inches) was set as the substrate 36 on the rotary stage 34, and the distance between the tip of the nozzle 32 and the substrate 36 was set to 150 mm. The temperature of the rotary stage 34 is raised to 500° C. by the heater 42 and held for 30 minutes for temperature stabilization. The flow control valve (not shown) was opened to supply nitrogen gas as the carrier gas G into the film forming chamber 30 through the mist generating chamber 22, and the atmosphere of the film forming chamber 30 was sufficiently replaced with the carrier gas G. After that, the flow rate of the carrier gas G was adjusted to 2.0 L/min.
(1c) Formation of Semiconductor Film (n$^+$ Layer)

While rotating the rotary stage 34 at a rotation speed of 30 rpm, the ultrasonic vibrator 26 was vibrated at 2.4 MHz to atomize the raw material solution L, and the generated mist M was introduced into the film forming chamber 30 by the carrier gas G. By causing the mist M to react in the film forming chamber 30, particularly on the surface of the substrate 36 (specifically, sapphire substrate), the semiconductor film 38 was formed on the substrate 36 for 0.8 hours. In this way, a composite material 40 composed of the substrate 36 and the semiconductor film 38 formed thereon was obtained.
(2) Evaluation of Semiconductor Film
(2a) Surface EDX As a result of composition analysis by energy dispersive X-ray analysis (EDX) on the surface of the obtained semiconductor film 38, Ga and O were mainly detected. From this, it was found that the semiconductor film 38 is composed of Ga oxide.

(2b) XRD

Using an X-ray diffraction (XRD) apparatus (D8-DIS-COVER, manufactured by Bruker-AXS), p scan was performed on the (104) plane of the corundum-type Ga oxide film at the center point X of the surface of the semiconductor film shown in FIG. 1 under the following conditions. That is, in the XRD measurement at the center point X, 2θ, ω, χ, and φ was adjusted to perform axial alignment so that the peak of the (104) plane of the α-Ga$_2$O$_3$ appears, and then measurement was performed by under conditions of a tube voltage of 40 kV, a tube current of 40 mA, a collimeter diameter of 0.5 mm, an anti-scattering slit of 3 mm, in a range of φ=−180° to 180°, an ep step width of 0.02°, and a counting time of 0.5 seconds. As a result, the peak of the (104) plane of α-Ga$_2$O$_3$ having three-fold symmetry was detected, and it was confirmed that the semiconductor film was a corundum-type Ga oxide film.

(2c) Film Thickness

The film thickness was evaluated by TEM observation of the cross-section. The test piece used for the TEM observation was prepared by sampling the composite material 40 separately by the same method as in (1) above from the vicinity of five points of the center point X and the outer circumferential points A, B, C, and D shown in FIG. 1 by FIB, and thinning the sample by ion milling. Using a transmission electron microscope H 90001UHR I manufactured by Hitachi, Ltd., cross-section observation was performed at an acceleration voltage of 300 kV, film thicknesses were measured for each sample, and the average value of the film thicknesses of five samples was taken as the semiconductor film thickness. The results were as shown in Table 1.

(2d) Raman Spectrum

Figure 5:
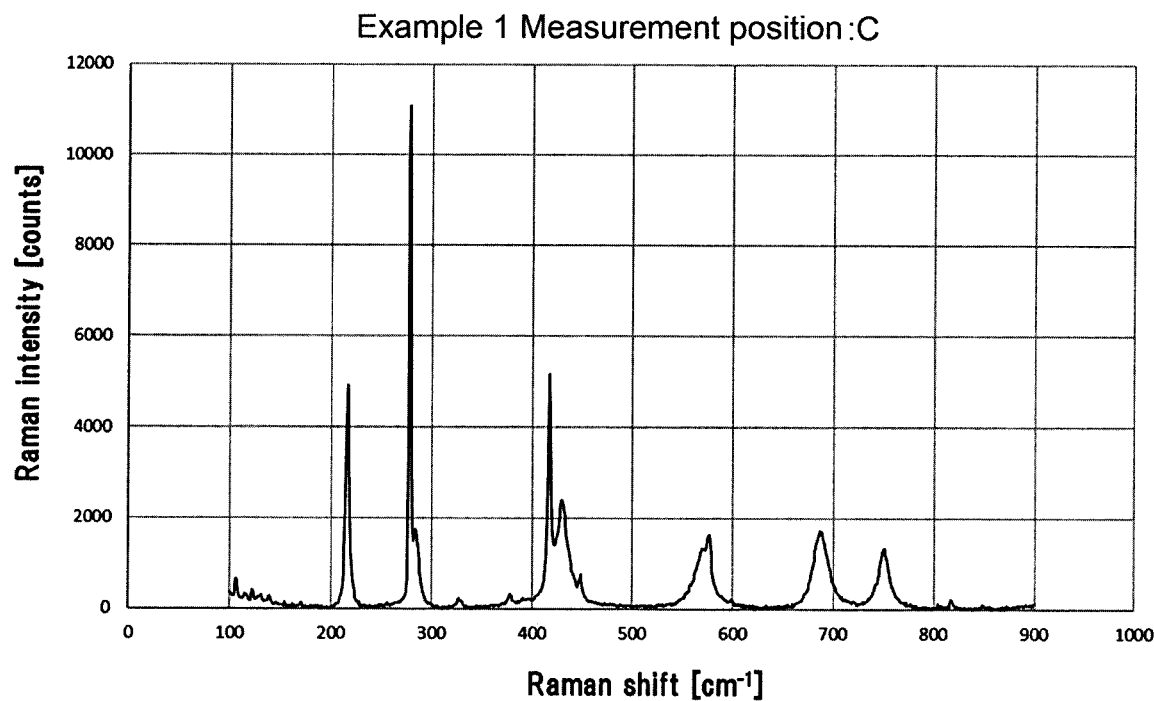
FIG. 5 is a Raman spectrum measured at the outer circumferential point C of the semiconductor film prepared in Example 1.

Raman spectra at the center point X and the outer circumferential points A, B, C, and D of the film surface of the semiconductor film 38 were measured using a laser Raman spectroscopic measurement device LabRAM ARAMIS manufactured by Horiba, Ltd. and operation software LabSpec (Ver. 5.78). The optical system was a Czerny-Turner spectroscopic system using a backscattering system, and a semiconductor excitation solid-state laser (DPSS, 532 nm) was used as a light source. Before the measurement of the sample, calibration was performed using a Si wafer. The Raman spectrum of the semiconductor film 38 was measured in a point analysis mode in which the laser output was adjusted to 24 mW, the hole (confocal hole size) was 400 µm, the center wave number of the spectroscope was 520 cm$^{-1}$, the slit was 100 µm, the grating was 1800 gr/mm, and the objective lens was 100 times. The exposure time was 60 seconds, the number of integrations was 2, and the wave number range was 100 to 900 cm$^{-1}$. The neutral density filter was appropriately set so that the count of the strongest peak was 3000 or more and 50000 or less. A Ne lamp was used for the measurement, and the spectrum was corrected so that the wave number of the peak top of the peak caused by the Ne lamp emission line was 278.28 cm$^{-1}$ with respect to the obtained spectrum. The baseline was corrected by setting "Type" to "Lines", "Degree" to "5", "Attach" to "No", "Style" to "-", and "Auto" in the function on the software LabSpec. For the spectrum thus obtained, the peak width at the height corresponding to the count number of ½ of the count number of the peak top of the peak in the vicinity of 216 cm$^{-1}$ was obtained as the full width at half maximum. The full width at half maximum thus obtained at the center point X and the outer circumferential points A, B, C, and D were designated as $W_X$, $W_A$, $W_B$, $W_C$, and $W_D$. In order to understand the variation of the full widths at half maximum at each point, the standard deviation of $W_S$ and the arithmetic average value $W_M$ of these full widths at half maximum $W_X$, $W_A$, $W_B$, $W_C$, and $W_D$ were calculated, respectively, and the ratio of $W_S$ to $W_M$, $W_S/W_M$, was used as an index of the variation. The results were shown in Table 1. Table 1 also shows wave numbers $N_X$, $N_A$, $N_B$, $N_C$, and $N_D$ of peak tops of peaks in the vicinity of the 216 cm$^{-1}$ at the center point X and the outer circumferential points A, B, C, and D. Further, FIG. 5 shows a Raman spectrum measured at the outer circumferential point C of the semiconductor film 38.

(2e) Dielectric Breakdown Voltage of Device (Preparation of Device)

Figure 4:
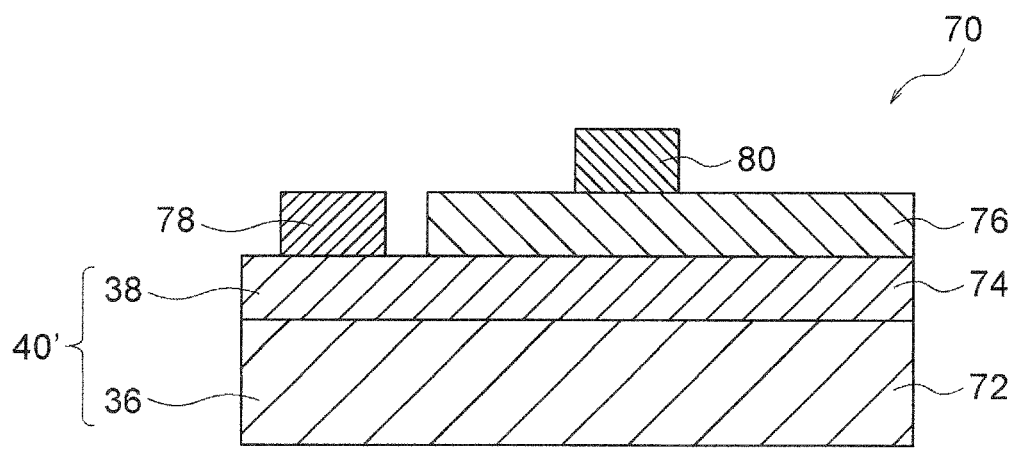
FIG. 4 is a schematic cross-sectional view showing a layer structure of a Schottky barrier diode prepared in Examples 1 to 8.

The composite material 40 obtained in (1c) above was cut into 10 mm squares so that the center point X and the outer circumferential points A, B, C, and D were substantially centered, thereby obtaining five composite material pieces 40'. As shown in FIG. 4, the composite material piece 40' is composed of the substrate 36 and the semiconductor film 38, and in preparation of a device, the substrate 36 is used as a base substrate 72 and the semiconductor film 38 is used as an n$^+$ layer 74. After a region of 2 mm×10 mm from the end portion on the surface of the composite material piece 40' on the semiconductor film 38 (n$^+$ layer 74) side was masked with a sapphire substrate (not shown), an n$^−$ layer 76 was formed. The n$^−$ layer 76 was formed in the same manner as in (1) above except that the dopant (tin (II) chloride) was not added in the preparation of the raw material solution in (1a) above and that the film formation was performed for 30 minutes in (1c) above. After formation of the n$^−$ layer 76, the sapphire substrate (not shown) as a mask was removed to expose the n$^+$ layer 74. A Ti electrode 78 (ohmic electrode, diameter 60 µm) was formed in the exposed region of the n$^+$ layer 74, and a Pt electrode 80 (Schottky electrode, diameter 60 µm) was formed on the n$^−$ layer. In this way, a horizontal Schottky barrier diode 70 as shown in FIG. 4 was produced.

(Evaluation of Dielectric Breakdown Voltage)

First, in the Schottky barrier diode 70, a current value (ON current) when 10 V was applied in the forward direction and a current value (OFF current) when 10 V was applied in the reverse direction were measured, and these values differed by more than three orders of magnitude; therefore, it was confirmed that the Schottky barrier diode was produced. Further, the dielectric breakdown voltage of the Schottky barrier diode 70 was measured. The dielectric breakdown voltage was measured by gradually increasing the applied voltage in the reverse direction in increments of 5 V, and determining the voltage at which the leakage current increases rapidly (by more than one order of magnitude) and the current value becomes higher than the current value at the time of the initial voltage application, even when a lower voltage is applied again. This measurement was performed on each of the Schottky barrier diodes 70 produced from five positions of the center point X and the outer circumferential points A, B, C, and D of the semiconductor film 38, and the dielectric breakdown voltages obtained from the respective positions were designated as $B_X$, $B_A$, $B_B$, $B_C$, and $B_D$, respectively. In order to understand the variation in the dielectric breakdown voltage, the standard deviation $B_S$ and the arithmetic average value $B_M$ of the dielectric breakdown voltages $B_X$, $B_A$, $B_B$, $B_C$, and $B_D$ were calculated, and the ratio of $B_S$ to $B_M$ ($B_S/B_M$) was used as an index of the variation. The results were shown in Table 1.

In this example, the Schottky barrier diode 70 is in the form of a horizontal device for simply evaluating the equalization of the device, but a vertical device produced by removing the base substrate 72 also shows the same tendency as the horizontal device of this example.

Examples 2 and 3

A semiconductor film was prepared, and various evaluations were performed in the same manner as in Example 1, except that the apparatus and film formation conditions in (1b) and (1c) above were changed as shown in Table 1. The results were as shown in Table 1.

Example 4

A semiconductor film was prepared, and various evaluations were performed in the same manner as in Example 1, except that the raw material solution of (1a) above was prepared as follows and the apparatus and film formation conditions in (1b) and (1c) above were changed as shown in Table 1. The results were as shown in Table 1.
(Preparation of Raw Material Solution)

An aqueous raw material solution containing gallium bromide and germanium oxide in a substance amount ratio of 100:5 was prepared. This aqueous solution contained 10% by volume of a 48% hydrobromic acid solution. The concentration of germanium (IV) oxide in the obtained raw material solution was $3.0 \times 10^{-3}$ mol/L.

Example 5

A semiconductor film was prepared, and various evaluations were performed in the same manner as in Example 1, except that the apparatus and film formation conditions in (1b) and (1c) above were changed as shown in Table 1, and a composite base substrate prepared as follows was used as the substrate 36 in the film formation in (1c) above. The results were as shown in Table 1.
(Preparation of Composite Base Substrate)
(a) Preparation of Orientation Precursor Layer To 100 parts by weight of commercially available $Cr_2O_3$ powder, 2.4 parts by weight of $TiO_2$ powder was added for wet-mixing, and the resulting mixed powder was subjected to a pulverization treatment in a pot mill to obtain a $Cr_2O_3/TiO_2$ mixed powder having a particle size $D_{50}$ of 0.4 μm as a raw material powder. An AD film was formed on a seed substrate (sapphire substrate) by an aerosol deposition (AD) apparatus 50 shown in FIG. 3 using this raw material powder and sapphire (diameter 5.08 cm (2 inches), thickness 0.43 mm, c-plane, off-angle 0.2°) as the seed substrate. The configuration of the aerosol deposition (AD) apparatus 50 is as described above.

The AD film formation conditions were as follows. That is, $N_2$ was used as a carrier gas, and a ceramic nozzle having a slit having a long side of 5 mm and a short side of 0.3 mm was used. The scanning conditions of the nozzle were to move 55 mm in the direction perpendicular to the long side of the slit and forward, to move 5 mm in the long side direction of the slit, to move 55 mm in the direction perpendicular to the long side of the slit and backward, and to move 5 mm in the long side direction of the slit and opposite to the initial position, repeatedly at a scanning speed of 1 mm/s, and at the time of 55 mm movement from the initial position in the long side direction of the slit, scanning was performed in the direction opposite to the previous direction, and the nozzle returned to the initial position. This was defined as one cycle, and repeated for 300 cycles. In one cycle of film formation at room temperature, the set pressure of the transport gas was adjusted to 0.06 MPa, the flow rate was adjusted to 6 L/min, and the pressure in the chamber was adjusted to 100 Pa or less. The AD film (orientation precursor layer) thus formed had a thickness of about 60 μm.
(b) Heat Treatment of Orientation Precursor Layer The sapphire substrate on which the AD film (orientation precursor layer) was formed was taken out from the AD apparatus and annealed at 1600° C. for 4 hours in a nitrogen atmosphere.
(c) Measurement of Crystal Growth Thickness An AD film (orientation precursor layer) separately prepared by the same method as in (a) and (b) above was prepared and cut so as to penetrating the center portion of the substrate in a direction orthogonal to the plate surface. The cross-section of the cut sample was smoothed by lapping using diamond abrasive grains, and mirror-finished by chemical mechanical polishing (CMP) using colloidal silica. The obtained cross-section was photographed with a scanning electron microscope (SU-5000, manufactured by Hitachi High-Technologies Corporation). By observing the reflected electron image of the cross-section after polishing, it was possible to identify the orientation precursor layer (hereinafter referred to as polycrystalline portion) and the orientation layer that remained as polycrystals by the channeling contrast due to the difference in crystal orientation. As a result of estimating the thickness of each layer in this way, the film thickness of the orientation layer was about 50 μm, and the film thickness of the polycrystalline portion was about 10 μm.
(d) Grinding and Polishing The surface on the side derived from the AD film of the obtained substrate was ground using a grinding stone having a grit size of #2000 or less until the orientation layer was exposed, and then the plate surface was further smoothed by lapping using diamond abrasive grains. Thereafter, mirror finishing was performed by chemical mechanical polishing (CMP) using colloidal silica to obtain a composite base substrate having an orientation layer on a sapphire substrate. The surface of the substrate on the side derived from the AD film was designated as the "top surface". The amount of grinding and polishing was about 30 μm including the polycrystalline portion and the orientation layer, and the thickness of the orientation layer formed on the composite base substrate was about 30 μm.

Example 6

A semiconductor film was prepared, and various evaluations were performed in the same manner as in Example 5, except that the apparatus and film formation conditions in (1b) and (1c) above were changed as shown in Table 1, that a composite base substrate having a size of 10.0 cm (4 inches) was produced and used, and that the film formation range in the AD method was expanded to a region of four sides of 110 mm. The results were as shown in Table 1.

Examples 7 and 8 (Comparison)

Figure 6:
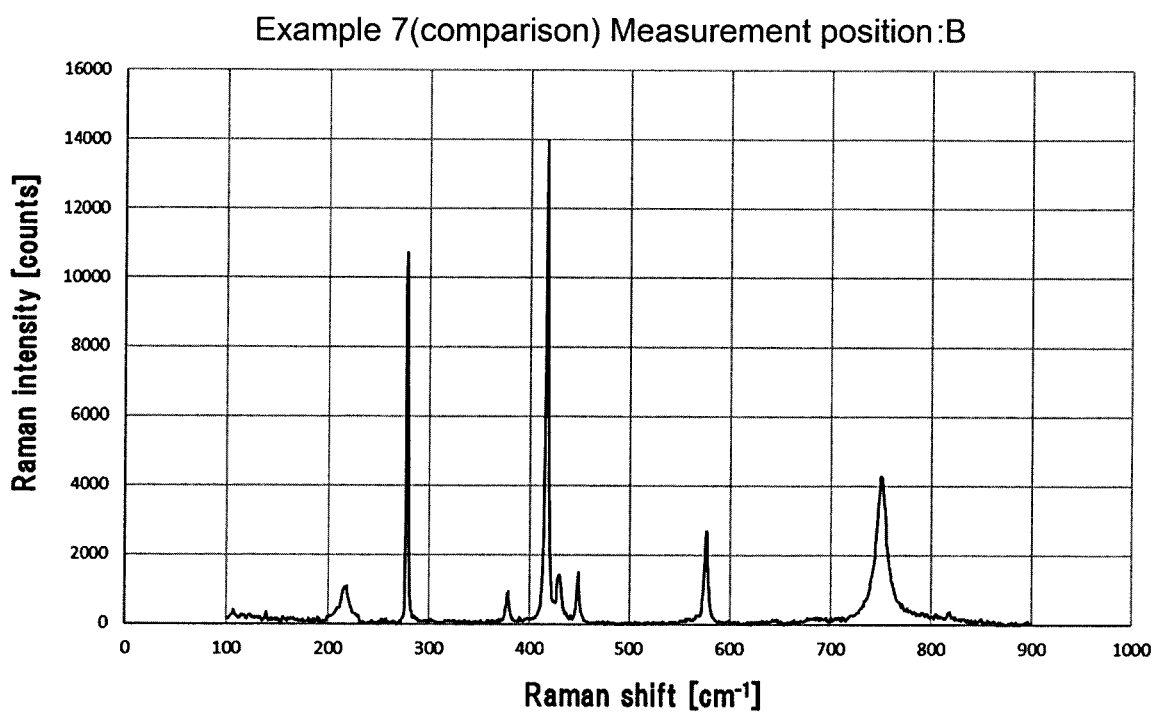
FIG. 6 is a Raman spectrum measured at the outer circumferential point B of the semiconductor film prepared in Example 7 (comparison).

A semiconductor film was prepared, and various evaluations were performed in the same manner as in Example 1, except that the apparatus and film formation conditions in (1b) and (1c) above were changed as shown in Table 1 (for example, the stage rotation speed was set to 0 rpm). The results were as shown in Table 1. Further, FIG. 6 shows a Raman spectrum measured at the outer circumferential point B of the semiconductor film obtained in Example 7.

TABLE 1

| | | Example 1 | Example 2 | Example 3 | Example 4 | Example 5 |
|---|---|---|---|---|---|---|
| Kind of substrate | | Sapphire | Sapphire | Sapphire | Sapphire | Composite base substrate |
| Substrate diameter (cm) | | 5.08 | 5.08 | 5.08 | 10.0 | 5.08 |
| Film formation time (h) | | 0.8 | 0.8 | 2.0 | 1.0 | 2.0 |
| Distance between nozzle tip and substrate (mm) | | 150 | 100 | 100 | 130 | 120 |
| Stage rotation speed (rpm) | | 30 | 180 | 190 | 160 | 0 |
| Film thickness (nm) | | 521 | 608 | 2834 | 1330 | 2115 |
| Full width at half maximum of peak in the vicinity of 216 cm$^{-1}$ in Raman spectrum (cm$^{-1}$) | $W_X$ | 4.2 | 4.5 | 4.3 | 4.6 | 3.9 |
| | $W_A$ | 4.1 | 4.5 | 4.2 | 4.8 | 4.2 |
| | $W_B$ | 5.0 | 4.6 | 4.2 | 4.8 | 3.8 |
| | $W_C$ | 4.4 | 4.4 | 4.3 | 4.7 | 4.0 |
| | $W_D$ | 5.2 | 4.5 | 4.4 | 4.8 | 4.2 |
| | arithmetic average value $W_M$*1 | 4.58 | 4.50 | 4.28 | 4.74 | 4.02 |
| | standard deviation $W_S$*1 | 0.49 | 0.07 | 0.08 | 0.09 | 0.18 |
| | variation index $W_S/W_M$ | $1.1 \times 10^{-1}$ | $1.6 \times 10^{-2}$ | $2.0 \times 10^{-2}$ | $1.9 \times 10^{-2}$ | $4.4 \times 10^{-2}$ |
| Wave number of peak in the vicinity of 216 cm$^{-1}$ in Raman spectrum (cm$^{-1}$) | $N_X$ | 215.7 | 215.2 | 216.1 | 215.8 | 215.4 |
| | $N_A$ | 215.4 | 215.8 | 215.4 | 217.6 | 214.8 |
| | $N_B$ | 217.7 | 216.2 | 214.9 | 216.8 | 214.6 |
| | $N_C$ | 216.7 | 215.6 | 215.2 | 215.9 | 214.7 |
| | $N_D$ | 217.6 | 215.3 | 215.4 | 217.8 | 215.0 |
| Dielectric breakdown voltage of device (V) | $B_X$ | 250 | 260 | 245 | 240 | 360 |
| | $B_A$ | 230 | 245 | 255 | 170 | 320 |
| | $B_B$ | 180 | 295 | 230 | 215 | 330 |
| | $B_C$ | 220 | 265 | 245 | 230 | 345 |
| | $B_D$ | 170 | 230 | 270 | 150 | 385 |
| | arithmetic average value $B_M$*2 | 210 | 259 | 249 | 201 | 348 |
| | standard deviation $B_S$*2 | 33.9 | 24.3 | 14.7 | 39.1 | 25.6 |
| | variation index $B_S/B_M$ | 0.16 | 0.09 | 0.06 | 0.19 | 0.07 |

| | | Example 6 | Example 7* | Example 8* |
|---|---|---|---|---|
| Kind of substrate | | Composite base substrate | Sapphire | Sapphire |
| Substrate diameter (cm) | | 10.0 | 5.08 | 5.08 |
| Film formation time (h) | | 3.0 | 0.8 | 3.0 |
| Distance between nozzle tip and substrate (mm) | | 130 | 50 | 30 |
| Stage rotation speed (rpm) | | 160 | 0 | 0 |
| Film thickness (nm) | | 3814 | 620 | 3986 |
| Full width at half maximum of peak in the vicinity of 216 cm$^{-1}$ in Raman spectrum (cm$^{-1}$) | $W_X$ | 3.8 | 4.5 | 6.8 |
| | $W_A$ | 3.7 | 9.1 | 8.4 |
| | $W_B$ | 3.7 | 10.0 | 7.5 |
| | $W_C$ | 3.6 | 8.5 | 8.4 |
| | $W_D$ | 3.7 | 5.8 | 9.2 |
| | arithmetic average value $W_M$*1 | 3.70 | 7.58 | 8.06 |
| | standard deviation $W_S$*1 | 0.07 | 2.33 | 0.93 |
| | variation index $W_S/W_M$ | $1.9 \times 10^{-2}$ | $3.1 \times 10^{-1}$ | $1.1 \times 10^{-1}$ |
| Wave number of peak in the vicinity of 216 cm$^{-1}$ in Raman spectrum (cm$^{-1}$) | $N_X$ | 214.8 | 216.7 | 218.4 |
| | $N_A$ | 214.9 | 217.9 | 217.4 |
| | $N_B$ | 213.8 | 218.4 | 218.2 |
| | $N_C$ | 214.1 | 218.1 | 218.0 |
| | $N_D$ | 213.9 | 217.8 | 218.3 |
| Dielectric breakdown voltage of device (V) | $B_X$ | 485 | 190 | 50 |
| | $B_A$ | 460 | 105 | 40 |
| | $B_B$ | 470 | 90 | 80 |
| | $B_C$ | 485 | 30 | 35 |
| | $B_D$ | 495 | 75 | 45 |
| | arithmetic average value $B_M$*2 | 479 | 98 | 50 |
| | standard deviation $B_S$*2 | 13.9 | 58.6 | 17.7 |
| | variation index $B_S/B_M$ | 0.03 | 0.60 | 0.35 |

*indicates a comparative example.
*1 $W_M$ is the arithmetic average value of $W_X$, $W_A$, $W_B$, $W_C$, and $W_D$, and $W_s$ is the standard deviation of $W_X$, $W_A$, $W_B$, $W_C$, and $W_D$
*2 $B_M$ is the arithmetic average value of $B_X$, $B_A$, $B_B$, $B_C$, and $B_D$, and $B_s$ is the standard deviation of $B_X$, $B_A$, $B_B$, $B_C$, and $B_D$

What is claimed is:

1. A semiconductor film having a crystal having a corundum-type crystal structure composed of α-Ga$_2$O$_3$ or an α-Ga$_2$O$_3$ solid solution as a main phase,
wherein the semiconductor film has a size in which a diameter of a largest circle inscribed in an outer circumference of the semiconductor film is 5.08 cm (2 inches) or more,
wherein at a center point X and each of four outer circumferential points A, B, C, and D of the largest circle inscribed in the outer circumference of the semiconductor film on a surface of the semiconductor film, a full width at half maximum of a peak in a vicinity of 216 cm$^{-1}$ in Raman spectrum of the semiconductor film, as measured by laser Raman spectroscopy, is 6.0 cm$^{-1}$ or less, wherein the outer circumferential points A, B, C, and D are determined such that i) a straight line connecting the outer circumferential points A and C and a straight line connecting the outer circumferential points B and D intersect at a right angle to each other at the center point X, and ii) respective shortest distances of the outer circumferential points A, B, C, and D from an outer edge of the semiconductor film are ⅕ of a radius of the semiconductor film, and wherein $W_S/W_M$ is $8.0\times10^{-2}$ or less, where $W_M$ is an arithmetic average value of the full widths at half maximum measured at the center point X and the outer circumferential points A, B, C, and D, and $W_S$ is a standard deviation of the full widths at half maximum.

2. The semiconductor film according to claim 1, wherein an arithmetic average value of thicknesses of the semiconductor film measured at the center point X and the outer circumferential points A, B, C, and D is 2.0 μm or more.

3. The semiconductor film according to claim 1, wherein at each of the center point X and the outer circumferential points A, B, C, and D, a wave number of a peak top of the peak in the vicinity of 216 cm-1 is 217.8 cm$^{-1}$ or less.

4. The semiconductor film according to claim 1, wherein the semiconductor film contains a Group 14 element as a dopant at a proportion of $1.0\times10^{16}$ to $1.0\times10^{21}$/cm$^3$.

5. The semiconductor film according to claim 1, wherein the semiconductor film is formed on a support substrate having a size in which a diameter of the largest circle inscribed in an outer circumference is 5.08 cm (2 inches) or more.

6. A composite material comprising:
a support substrate having a size in which the diameter of the largest circle inscribed on an outer circumference is 5.08 cm (2 inches) or more; and
the semiconductor film according to claim 1 formed on the support substrate.

* * * * *